United States Patent [19]

Wikswo, Jr. et al.

[11] Patent Number: 5,408,178
[45] Date of Patent: Apr. 18, 1995

[54] APPARATUS AND METHOD FOR IMAGING THE STRUCTURE OF DIAMAGNETIC AND PARAMAGNETIC OBJECTS

[75] Inventors: John P. Wikswo, Jr., Brentwood, Tenn.; Alan Lauder, Kennett Square, Pa.

[73] Assignees: Vanderbilt University, Nashville, Tenn.; E.I. Du Pont de Nemours and Company, Wilmington, Del.

[21] Appl. No.: 702,586

[22] Filed: May 17, 1991

[51] Int. Cl.$^6$ .................. G01N 27/76; G01R 33/16
[52] U.S. Cl. ................................. 324/201; 324/226
[58] Field of Search .............. 324/201, 226, 248, 309

[56] References Cited

U.S. PATENT DOCUMENTS

| | | |
|---|---|---|
| 3,980,076 | 9/1976 | Wikswo, Jr. et al. . |
| 4,079,730 | 3/1978 | Wikswo, Jr. et al. . |
| 4,827,217 | 5/1989 | Paulson ............................. 324/201 |
| 4,859,943 | 8/1989 | Evans et al. ....................... 324/216 |
| 4,969,496 | 11/1990 | Mills ................................. 324/201 |
| 5,073,858 | 12/1991 | Mills ................................. 314/201 |

FOREIGN PATENT DOCUMENTS 0311186 12/1988 Japan .................................. 324/201

OTHER PUBLICATIONS

"Biomagnetic Instrumentation," Romani et al., Rev. Sci. Instrum., vol. 53, No. 12, Dec. 1982.
D. C. Barber, A Review Of Image Reconstruction Techniques For Electrical Impedance Tomograph, Department of Medical Physics and Clinical Engineering, Royal Hallamshire Hospital Sep. 9, 1988, pp. 162–169.
Bates, et al., A Limitation Of Systems For Imaging Electrical Conductivity Distribution, IEEE Transactions on Biomedical Engineering, vol. BME-27, No. 7, Jul. 1980, pp. 418–420.
Clark et al, Tagged Adhesives For Improved Electromagnetic Inspection, The American Society for Nondestructive Testing, Inc., Materials Evaluation/48/Jan. 1990 pp. 60–64.
Clark et al., Tagging Lets You Test The Untestable, Advanced Materials & Processes Apr. 1990 pp. 59–69.
M. Hashimoto, et al., Nondestructive Testing Using Magnetic Field Visualization Technique, Review of Progress in Quantitative Nondestructive Evaluation, vol.9, pp. 585–592 1990.
D. E. Farrell, et al., Non-Invasive Squid Diagnosis Of Liver Iron Overload, 1981, pp. 507–518 (no month).
S. H. H. Sadeghi, et al., A New Technique For Sizing Cracks In Metals, Utilizing An Induced Surface Magnetic Field, Review of Progress in Quantitative Nondestructive Evaluation, vol. 9 1990, pp. 593–600.
C. M. Bastuscheck, et al., Technique For Measuring The AC Susceptibility Of Portions Of The Human Body Or Other Large Objects J. Appl. Phys, 58(10), 15 Nov. 1985, ppp. 3896–3906.
Skeketee et al., Measurement Of Magnetic Susceptibility In Living Rats, Med. & Biol. Eng. & Comput, 1980, 18, pp. 253–260.
Czipott et al., Use Of A Superconductive Gradiometer In An Ultrasensitive Electromagnetic Metal Detector, IEEE Transactions on Magnetics, vol. 25, No. 2, Mar. 1989, pp. 1204–1207.

(List continued on next page.)

*Primary Examiner*—Walter E. Snow
*Attorney, Agent, or Firm*—Richard V. Westerhoff

[57] ABSTRACT

The surface or internal structure of diamagnetic and paramagnetic materials is imaged by measuring, preferably with a superconducting quantum interference device (SQUID) magnetometer, perturbations to an applied magnetic field resulting from variations in magnetic susceptibility at an array of locations across the object. The array of perturbation measurements is processed to generate a map of local susceptiblities. For implementation of susceptibility tomography, multiple arrays of perturbation signals for a plurality of relative orientations between the object, the field, and the measurement locations are processed to generate values for local susceptibility at selected sites within the object, such as along a selected sectional plane.

25 Claims, 6 Drawing Sheets

OTHER PUBLICATIONS

S. Evanson, et al., A Comparison Of The Performance Of Planar And Conventional Second Order Gradiometers Coupled To A Squid For The NDT Of Steel Plates, IEEE Transactions of Magnetics, vol. 2, Mar. 1989, pp. 1200–1203.

S. DiLuzio, et al., Magnetic Mapping Of DC Fields Related To Tissue Susceptibility In The Human Body, Advances in Bio-Magnetism, pp. 505–508 (Aug. 1989).

Weinstock, A Review Of Squid Magnetometry Applied To Non-Destructive Evaluation, presented at ACS '90, (Aug. 10, 1987).

E. J. Cukauskas, et al. Magnetic Susceptibility Measurements Using A Superconducting Magnetometer, Rev. Sci. Instrum., vol. 45, No. 1, Jan., 1974, pp. 1–6.

J. S. Philo, et al. High-Sensitivity Magnetic Susceptometer Employing Superconducting Technology, Rev. Sci. Instrum., vol. 48, No. 12, Dec. 1977, pp. 1529–1536.

D. N. Paulson et al. Superconducting Magnetometer System For Detecting Lung Containments, IEEE Transactions on Magnetics vol. Mag-23, No. 2, Mar. 1987, pp. 1315–1318.

D. Rassi et al., Squid Measurements And Computational Modelling Of A Simple Thorax Phantom, Biomagnetism '87 6th International Conference on Biomagnetism, Tokyo, Japan Aug. 27, 1930 pp. 402–405.

John P. Wikswo, Jr., Noninvasive Magnetic Detection Of Cardiac Mechanical Activity: Theory, Med. Phys. 7(4), Jul./Aug. 1980 pp. 297–306.

John P. Wikswo, Jr., et al., Noninvasive Magnetic Detection Of Cardiac Mechanical Activity: Experiments, Med. Phys. 7(4), Jul./Aug. 1980, pp. 307–313.

APPARATUS AND METHOD FOR IMAGING THE STRUCTURE OF DIAMAGNETIC AND PARAMAGNETIC OBJECTS

BACKGROUND OF THE INVENTION

1. Field of the Invention

This invention relates to apparatus and a method for imaging the internal structure of objects which are paramagnetic or diamagnetic using a sensitive magnetometer, and particularly a superconducting quantum interference device (SQUID) magnetometer, to measure local magnetic susceptibility through the object.

Background Information

There is a continued interest in expanding the techniques available for imaging the internal structure of opaque objects for such diverse purposes as medical diagnosis and non-destructive evaluation (NDE) of inanimate objects. Use of x-rays to image the internal features of opaque objects is well known, especially in the field of medical imaging. X-ray tomography wherein images along selected planes through a subject are constructed from data gathered from x-rays passed through the object in multiple directions is also well established. However, the ionizing radiation used in x-ray imaging has long been recognized as posing a health risk. Also, x-rays are best suited to imaging features defined by variations in density, and therefore, are not helpful in imaging soft tissue features. Furthermore, it is difficult to image the internal structure of objects that are strong absorbers of x-rays. Regions in an object that are strong absorbers can produce noticeable image artifacts in adjacent, less strongly absorbing regions.

Eddy current testing, wherein the effects of cracks and other defects in an electrically conductive object on the impedance of a coil which induces eddy currents in the conductive object is widely used in industry for non-destructive testing. However, the information obtained is very limited and highly skilled technicians are required to interpret the signals generated. Furthermore, eddy current techniques are primarily used to detect surface-breaking flaws since the signal strength falls off as the inverse 6th power of the distance between the flaw and the detector, and because the high-frequency electromagnetic fields used typically penetrate no more than a fraction of a millimeter into the conducting object.

Another technique for imaging the internal structure of opaque objects is ultrasound in which high frequency sound is injected into the object and the echoes are used to map internal features creating the echoes. Difficulties with this technique include distortion created by internal reflections of the sound waves. Also, many objects have to be immersed in a water bath to couple the ultrasound. It is also difficult to obtain quantitative measures of flaw size, and because of strong reflections from surfaces, it is difficult to image flaws just beneath a surface. It is also impossible to "see through" air pockets in an object with ultrasound.

More recently, magnetic resonance imaging (MRI) has become widely used for medical imaging. A very intense magnetic field is applied to the subject to align the nuclei in the area of interest. Pulses of rf energy are then applied to disturb this orientation. Energy released by relaxation of the nuclei between pulses is detected and then processed to produce the image. Through control of the frequency of the rf energy and the magnetic field, resonance can be induced at a desired location within the subject, and thus images along a selected plane through the subject can be generated. While MRI produces sharp images, the cost is very high and the intense magnetic fields required for the technique have raised concerns.

The use of magnetic fields for non-invasive examination of biological organisms and for non-destructive testing has also been investigated. Superconducting quantum interference devices (SQUIDS), which are highly sensitive detectors of magnetic fields, have led to the development of several such techniques. While there are other sensitive detectors of weak magnetic fields, such as flux gates, SQUIDs offer the unique combination of sensitivity, wide dynamic range, linearity and frequency response, and are thus able to detect very weak magnetic fields in the presence of much stronger magnetic fields. The most sensitive small-sample superconducting susceptometer on the commercial market manufactured by Quantum Design of San Diego, Calif., utilizes SQUID magnetometers to measure the sample-induced perturbations in an intense magnetic field that is produced by a superconducting magnet. Such susceptometers are used to study the properties of high temperature superconductors, biological molecules, and other materials.

One of the most widely publicized applications of SQUID magnetometers is in the measurement of the magnetic fields produced by bioelectric activity in the human heart and brain. In these biomagnetometers, a SQUID is connected to a superconducting pick-up loop to form a differential magnetometer that is relatively immune to uniform magnetic fields, but is highly sensitive to the magnetic fields produced by the electrical activity in the brain and other organs. A number of these SQUIDs are arranged in an array which is placed adjacent to the head or chest of the subject being studied. The SQUIDs in the array are electronically scanned and the pattern of magnetic signals detected is inverted mathematically in an attempt to map the electrical activity generating the field. As the mathematical inversion has an indeterminate solution for a random distribution of three-dimensional current sources, the technique has had some success in localizing single dipole sources, but much less success in mapping multiple bioelectrical dipole sources. This technique is only sensitive to systems that exhibit internal electrical current sources.

A lesser amount of activity has been directed to the use of sensitive magnetometers to make magnetic measurements for non-destructive testing or evaluation. One technique has been to apply an electric current, directly or through induction, to a substantially geometrically regular object and to observe, in the magnetic field generated by the current, perturbations caused by flaws, such as cracks or holes in the object. Typically, the magnetometer is scanned over the object to locate the perturbations resulting from the flaw. Obviously the object must be electrically conductive. Only limited information about the object and the flaw can be obtained from such a technique, since the current distribution, and therefore, the magnetic field, is dependent upon the distribution of conductivity through the object. One flaw could perturb the distribution throughout the object, and hence render other flaws less easily detectable.

Work has also been done in mapping perturbations in a magnetic field applied to ferromagnetic materials to locate flaws such as cracks and holes. Such a technique can provide a map of the resulting perturbations in the magnetic field external to the object, but can only provide a qualitative evaluation of structural details of the flaw. The difficulty lies in the fact that the orientation of the induced or remnant magnetic dipoles in the ferromagnetic materials, which distort the applied field, is unknown. Sequential measurement of both the induced and remnant magnetic fields in ferromagnetic materials has been used to determine the state of heat treatment to which the material has been subjected.

Techniques have been developed for non-invasive analysis of human organs based upon measurements of variations in magnetic susceptibility. U.S. Pat. Nos. 3,980,076 and 4,079,730, which share a common inventor with the subject invention, disclose a method and apparatus for making a quantitative evaluation of cardiac volume. The technique is based on the fact that the magnetic susceptibility of blood is substantially different from that of the heart and surrounding tissue. The heart is modeled as a sphere which changes in volume and moves within the chest cavity between the systole and diastole. Measurements are made at several points of perturbations in an applied magnetic field caused by the beating heart. These measurements are used to adjust the model until calculations made by the model match the empirical measurements. Patterns of normal and abnormal cardiac activity must be developed to evaluate the results.

Similar techniques have been applied to determine the amount of iron stored in a human liver which is useful in the diagnosis of certain medical conditions. A SQUID measures the perturbations to an applied magnetic field caused by a bag of water placed on the patient's abdomen which provides an indication of the bulk susceptibility of the water. The SQUID is then advanced toward the patient thereby flattening the water bag until the sensitive volume of the SQUID intersects the liver and additional measurements of the perturbations to the applied magnetic field are made. As in the case of determining cardiac volume, a physiological model is used to determine the concentration of iron in the liver. In this model, the liver is considered to be a continuous homogeneous mass, and hence, the bulk susceptibility of the liver is presumed in the model.

Another medical imaging technique which has received attention is electrical impedance tomography. This technique relies upon the differences in electrical resistivity in different tissues within the subject. As applied to cardiac imaging, a number of oppositely positioned electrode pairs are distributed around the torso and as electric currents are successively passed through the subject between electrode pairs, the electric voltage drop is measured across the electrode pair. As the current through tissue of any particular resistivity is dependent upon the resistivity of parallel current paths, imaging with this technique is difficult.

U.S. Pat. No. 4,982,158 suggests a non-destructive testing technique in which currents are injected into an electrically conductive or semiconductive object from two or more directions and the resulting magnetic field is mapped with a SQUID array to detect inhomogeneities in the object.

There remains a need for a system for imaging the surface and internal structure of opaque objects which provides good detail without the need for ionizing radiation or high field intensities, and at a reasonable cost.

SUMMARY OF THE INVENTION

This and other objects are realized by the invention which is directed to a system and a method of mapping local magnetic susceptibility to generate an image of the surface or internal structure of an object. The invention is based upon the principle that all materials, even diamagnetic materials generally considered to be non-magnetic, can in fact be at least weakly magnetized. The invention is useful for the imaging of objects made of materials and combinations of materials which are diamagnetic and paramagnetic. Such materials may be characterized by the fact that while they may be magnetized, the magnetic dipoles are so weak that they do not have any appreciable distorting effect upon the magnetizing field applied to adjacent molecules of the object. Thus, the invention can also be used to image features of diamagnetic and paramagnetic materials with embedded superparamagnetic and even ferromagnetic materials as long as the concentration of the superparamagnetic or ferromagnetic material is not so great as to appreciably distort the applied magnetic field permeating the features of the object to be imaged.

More particularly, the invention is directed to a system and method for imaging the internal or surface features of objects composed substantially of diamagnetic and/or paramagnetic materials which include applying a magnetic field to the object with a known strength, orientation, and time dependence. This includes utilization of the earth's magnetic field as the magnetizing field with the object positioned in a known orientation with respect to the field. Preferably, the applied magnetic field is generated by an electromagnet. A superconducting magnet, which can be housed within the same cold volume as houses a SQUID used as the magnetometer to detect perturbations in the magnetic field due to local susceptibility in the object, could be used to generate the applied magnetic field, but is not essential. In fact, a uniform field such as is produced by a Helmholtz coil pair is preferred. Perturbations in the applied magnetic field at an array of locations across the object are measured by magnetometer means to generate an array of perturbation signals. This array of perturbation signals is processed to generate an array of signals representing a map of local susceptibility across the object.

A single magnetometer or a small array of magnetometers may be scanned over the object to generate the array of perturbation signals. This scan can be generated by movement of either the magnetometer or the object. Alternatively, the object is scanned electronically by a large array of magnetometers.

The invention includes susceptibility tomography in which the orientation of at least one of the magnetic field, the position of the array of magnetometer measurements, and the position of the object is varied to generate a plurality of arrays of perturbation signals which are used to determine the local susceptibility at selected sites in the object. Thus, the susceptibility at all locations through the object, or at selected sites such as for example along a given plane representing a section through the object, can be generated.

The variations in orientation needed to generate the plurality of arrays of perturbation signals can be produced by physical movement of the elements, or for instance by providing a plurality of sets of coils and/or magnetometer arrays and operating these multiple elements to generate the variable orientations.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENTS

Figure 1:
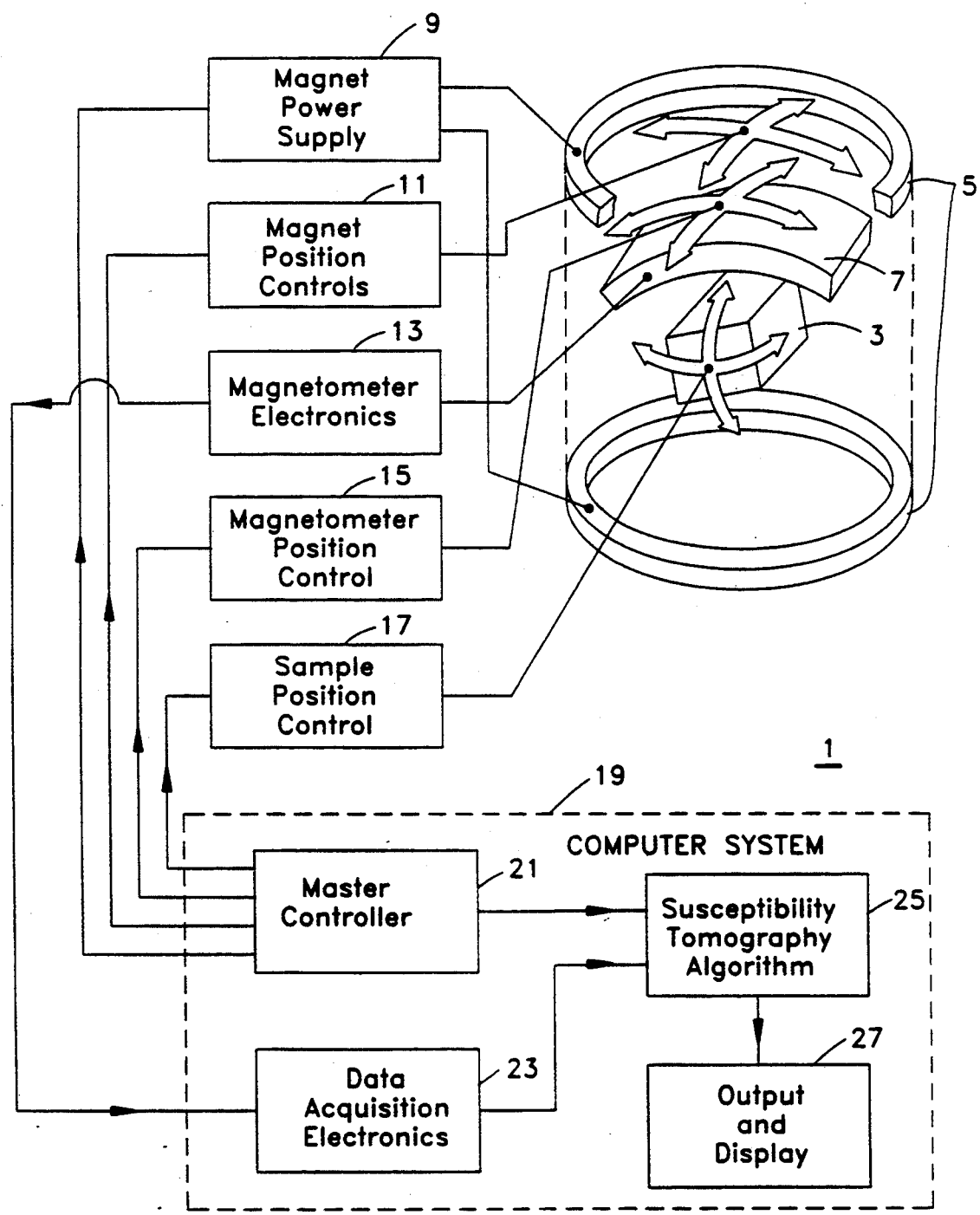
FIG. 1 is a schematic diagram of a susceptibility imaging system in accordance with the invention.

Broadly, the invention is directed to imaging the structure of objects made substantially of diamagnetic or paramagnetic materials by mapping local magnetic susceptibility in the object.

The magnetic susceptibility of a material is defined as the ratio of the magnetization density to the intensity of the magnetizing field and thus may be expressed by the relation:

$$\chi = \frac{M}{H} \tag{1}$$

where $\chi$ is the magnetic susceptibility, M is the magnetization density and H is the magnetic field intensity.

The magnetization of the material has an effect on the magnetic field which may be written as:

$$B = \mu_0(H+M) \tag{2}$$

where B is the field and $\mu_0$ is the permeability of free space. As can be seen, the field B is the sum of the applied field H plus the field contributed by magnetization M of the material that is produced by the applied field. Substituting Equation 1 into Equation 2 results in:

$$B = \mu_0(1+\chi)H = \mu_0\mu_r H = \mu H \tag{3}$$

where $\mu_r$ is the relative permeability and $\mu$ is the absolute permeability and:

$$\mu_r = 1 + \chi \tag{4}$$

In ferromagnetic materials, $\chi$ dominates so that:

$$\mu_r(\text{iron}) \simeq \chi = 10^2 \text{ to } 10^5 \tag{5}$$

On the other hand, in diamagnetic, and to a lesser extent paramagnetic materials, $\chi$ is very much smaller than one, and hence, has only very small effect on relative permeability. Thus, for diamagnetic materials for which $\chi \simeq -10^{-5}$:

$$\mu_r(\text{diagramatic}) = 1 - 10^{-5} \simeq 1 \tag{6}$$

and for paramagnetic materials for which $\chi \simeq 10^{-2}$:

$$\mu_r(\text{paramagnetic}) = 1 + 10^{-2} \simeq 1 \tag{7}$$

What this means is that in ferromagnetic materials, the magnetization M has a strong effect on the field intensity, H, within the material and the magnetic dipoles are coupled to the surrounding magnetic dipoles and hence it is not readily possible to determine the field, B, within the ferromagnetic material.

However, in diamagnetic and paramagnetic materials the magnetization has neglible effect on the applied field, about five to eleven orders of magnitude less than in ferromagnetic materials. Thus, in accordance with the Born approximation, the effects of magnetic dipoles within diamagnetic and paramagnetic materials on the magnetization of adjacent regions of the material can be ignored. Still, perturbations to the applied field as a result of magnetization of the diamagnetic or paramagnetic material can be measured by a sensitive magnetometer.

In accordance with the invention, measurements of the perturbations to an applied magnetic field across an object, or a selected portion of the object are used to calculate the local susceptibility in the object. A map of the local susceptibility represents an image of the structure of the object, and thus can be be used, for instance, to image different tissues within a biological sample, such as the organs, diseased tissue and non-ferromagnetic foreign objects, and to image defects such as cracks, voids and inclusions as well as internal structures in inanimate samples and tracer materials introduced into a sample. The latter can include, for example, introducing a tracer into the blood stream of a living subject, applying a tracer material over the surface of a sample to detect surface defects, and mixing the tracer material with a bulk material. The tracer material should have a susceptibility substantially different from the surrounding material. This can include the use of superparamagnetic materials and even ferromagnetic materials as tracers, so long as the concentration is not so great as to mask the features sought to be imaged.

In imaging the local susceptibility across a two-dimensional object made primarily of a paramagnetic or diamagnetic material, or imaging only the surface of a three dimensional object of such a material, the local perturbation measurements are converted to local susceptibility. This is possible because paramagnetic and diamagnetic materials are, in general, linear and non-hysteretic, and at the applied field strengths used, the susceptibility is independent of the applied field. As a result of Equations 6 and 7, we can usually work in the weak-field limit, which is also known as the Born approximation: at any point in the material we can ignore the contributions to the applied field from the magnetization elsewhere in the object and we are left only with the initial fields $\vec{B}_0$ and $\vec{H}_0$ and the local field $\vec{B}_1$ due to the local magnetization $\vec{M}(\vec{r}')$ at the source point $\vec{r}'$:

$$\vec{B}_0(\vec{r}') + \vec{B}_1(\vec{r}') = \mu_0\vec{H}_0(\vec{r}') + \mu_0\vec{M}(\vec{r}) \tag{8}$$

This is truly a local equation that is independent of the magnetization elsewhere in the sample. Because $\vec{M}$ is so weak, if we know $\vec{H}_0$ everywhere, we will then know $\vec{B}_0$ to at least one part in $10^2$ for a paramagnetic material with $\chi = 10^{-2}$, and to 1 part in $10^5$ for a diamagnetic material with $\chi = 10^{-5}$. Thus, we have eliminated a major problem in obtaining a self-consistent, macroscopic solution that is based upon the microscopic constructive equation given by Eq. 2. Since we know $\vec{B}_0(\vec{r}')$ and $\vec{H}_0(\vec{r}')$, we can thereby eliminate $\vec{B}_0$ and $\vec{H}_0$ from the problem and Eq. 8 becomes:

$$\vec{B}_1(\vec{r}) = \mu_0 \vec{M}(\vec{r}) \tag{9}$$

If $\vec{H}_0$ is uniform, the spatial variation of $\vec{M}(\vec{r}')$ is determined only by $\chi(\vec{r}')$, so that:

$$\vec{B}_1(\vec{r}) = \mu_0 \chi(\vec{r}) \vec{H}_0(\vec{r}) \tag{10}$$

For isotropic materials, x is a scalar and the direction of $\vec{M}$ is the same as that of $\vec{H}_0$; otherwise a tensor susceptibility is required.

In most cases, the magnetometer does not measure the magnetic field at the source point $\vec{r}'$, but instead at a distant "field" point $\vec{r}$. If the magnetometer measures only the very small perturbations $\vec{B}_1$ that are superimposed upon the stronger applied $\vec{B}_0$ the weak paramagnetism and diamagnetism can be detected. Hereafter, we will assume that the measurements are only of the perturbation field from either diamagnetic or paramagnetic materials. Suppose that a small element of volume dv' within the object has a magnetization $\vec{M}(\vec{r}')$, with the element being small enough that the magnetization can be assumed to be uniform throughout the element. The dipole moment of this elemental volume is simply:

$$\vec{dm} = \vec{M} dv' \tag{11}$$

The contribution of the magnetic field at the field point $\vec{r}$ from this element at $\vec{r}'$ is given by the dipole field equation:

$$d\vec{B}(\vec{r}) = \frac{\mu_0}{4\pi} \left\{ \frac{3 \vec{dm}(\vec{r}') \cdot (\vec{r} - \vec{r}')}{|\vec{r} - \vec{r}'|^5} (\vec{r} - \vec{r}') - \frac{\vec{dm}(\vec{r}')}{|\vec{r} - \vec{r}'|^3} \right\} \quad \text{Eq. 12}$$

The total magnetic field $\vec{B}(\vec{r}')$ is obtained by integrating the field from the magnetization associated with each elemental dipole:

$$\vec{B}(\vec{r}) = \frac{\mu_0}{4\pi} \int_{v'} \left\{ \frac{3 \vec{M}(\vec{r}') \cdot (\vec{r} - \vec{r}')}{|\vec{r} - \vec{r}'|^5} (\vec{r} - \vec{r}') - \frac{\vec{M}(\vec{r}')}{|\vec{r} - \vec{r}'|^3} \right\} dv' \quad \text{Eq. 13}$$

The general inverse problem involves solving Equation 13 for the vector magnetization $\vec{M}(\vec{r}')$ throughout the sample given a set of measurements of $\vec{B}(\vec{r})$. In general, this equation has no unique solution. However, if we know that $\vec{M}(\vec{r}') = \vec{x}(\vec{r}') \vec{H}_0(\vec{r}')$ we know the orientation of $\vec{M}$ everywhere. If we assume that $\vec{M}(\vec{r}') = M_z(\vec{r}')\hat{z}$, then we need only to solve for the scalar magnetization $M_z(\vec{r}')$ in the slightly simpler equation:

$$\vec{B}(\vec{r}) = \frac{\mu_0}{4\pi} \int_{x'} \int_{y'} \int_{z'} \left\{ \frac{3 M_z(\vec{r}')(z - z')}{|\vec{r} - \vec{r}'|^5} (\vec{r} - \vec{r}') - \frac{M_z(\vec{r}')\hat{z}}{|\vec{r} - \vec{r}'|^3} \right\} dx' dy' dz' \quad \text{Eq. 14}$$

The reduction of the number of unknowns from the three components of $\vec{M}(\vec{r}')$ to the single component $M_z(\vec{r}')$ represents a major simplification of the problem.

Within the constraints imposed by measurement noise and computational accuracy, this allows us, in general, to obtain a solution of Equation 14. Except is cases with special geometrical constraints, any single component of $\vec{M}$ could be used equally effectively.

If the source is restricted to two-dimensions, such as a thin sheet of diamagnetic or paramagnetic material, Equation 14 reduces to a two-dimensional surface integral. We will for now assume that we are applying only z-component field $H_0\hat{z}$, and are measuring only the z-component of the sample-induced magnetic field $\vec{B}$ at a height $(z - z')$ above the two-dimensional sample, so that we have:

$$B_z(\vec{r}) = \frac{\mu_0}{4\pi} \int_{x'=-\infty}^{\infty} \int_{y'=-\infty}^{\infty} \left\{ \frac{3 M_z(\vec{r}')(z - z')^2}{|\vec{r} - \vec{r}'|^5} - \frac{M_z(\vec{r}')}{|\vec{r} - \vec{r}'|^3} \right\} dx' dy' \quad \text{Eq. 15}$$

In practice, the integrals need not extend beyond the boundary of the source object, outside of which $\vec{M} \equiv 0$. In order to solve this equation for $M_z(\vec{r}')$, we first compute the two-dimensional spatial Fourier Transform (FT) of the magnetic field:

$$b_z(k_x, k_y, z) = FT\{B_z(x,y,z)\} \tag{16}$$

so that we can use the convolution theorem to express Equation 15 in the spatial frequency domain:

$$b_z(k_x, k_y, z) = g_z(k_x, k_y, z) m_z(k_x, k_y), \tag{17}$$

where $g_z(k_x, k_y, z)$ is the spatial Fourier transform of the Green's function:

$$G_z(\vec{r}, \vec{r}') = \frac{\mu_0}{4\pi} \left\{ \frac{3(z - z')^2}{|\vec{r} - \vec{r}'|^5} - \frac{1}{|\vec{r} - \vec{r}'|^3} \right\} \quad \text{Eq. 18}$$

and $m_z(k_x, k_y)$ is the spatial Fourier transform of the magnetization $M_z(x',y')$. The inverse problem then reduces to a division in the spatial frequency domain:

$$m_z(k_x, k_y) = \frac{b_z(k_x, k_y, z)}{g_z(k_x, k_y, z)} \quad \text{Eq. 19}$$

It may be necessary to use windowing techniques to prevent this equation from blowing up because of zeros in the Green's function occurring at spatial frequencies for which there is a contribution to the magnetic field from either the sample or from noise. Typically, the window $w(k_x,k_y)$ is a low-pass filter which attenuates high-frequency noise in the vicinity of the zeros of $g_z$, so that Equation 19 becomes:

$$m_z(k_x, k_y) = \frac{b_z(k_x, k_y, z)}{g_z(k_x, k_y, z)} w(k_x, k_y) \quad \text{Eq. 20}$$

As the final step, we use the inverse Fourier Transform (FT$^{-1}$) to obtain an image of the magnetization distribution:

$$M_z(x',y') = FT^{-1}\{m_z(k_x,k_y)\}, \tag{21}$$

which can then be used to obtain the desired susceptibility image:

$$\chi(x', y') = \frac{M_z(x', y')}{H_o} \quad \text{Eq. 22}$$

This provides one approach to two-dimensional magnetic susceptibility imaging. It is important to note that once the Green's function and the window have been specified, it is possible to proceed directly from $B_z(x,y)$ to $\chi(x',y')$ by evaluating the appropriate convolution integral in xy-space.

This embodiment of the invention is useful for instance in non-destructive evaluation of semi-conductor devices. The susceptibility of the various metals and insulators used in fabrication of silicon-based integrated circuits has a sufficiently high range of values to provide adequate contrast for susceptibility imaging of such devices. The following susceptibilities ($10^{-6}$ SI) are relevant to the semiconductor industry:

| Al | +21 | Cu | −10 | Si | −4 |
| Al$_2$O$_2$ | −18 | Ga | −23 | SiO$_2$ | −14 |
| Au | −34.5 | Ge | −71 | W | +80 |

For mapping the surface of a three dimensional object, such as for locating and quantifying surface defects, the sensitive volume of the magnetometer can be adjusted such as through selection of known designs for gradient pick-up coil arrangements, and/or, through shaping of the applied field.

An important aspect of the invention is susceptibility tomography.

Where, as in susceptibility tomography, the source is three-dimensional, a somewhat more general approach must be taken. We can start with Equation 12, the dipole field equation for the magnetic field $d\vec{B}(\vec{r})$ produced by a single magnetic dipole $d\vec{m}(\vec{r}')$. If the dipole moment arises from the magnetization of an incremental volume dv in an applied field $\vec{H}(\vec{r}')$, we have that:

$$d\vec{m}(\vec{r}') = \chi(\vec{r}')\vec{H}(\vec{r}')dv' \quad (23)$$

The dipole field equation then becomes:

$$d\vec{B}(\vec{r}) = \frac{\lambda_o \chi(\vec{r}')}{4\pi}\left\{ \frac{3\vec{H}(\vec{r}')\cdot(\vec{r}-\vec{r}')}{|\vec{r}-\vec{r}'|^5}(\vec{r}-\vec{r}') - \frac{\vec{H}(\vec{r}')}{|\vec{r}-\vec{r}'|^3} \right\}dv' \quad \text{Eq. 24}$$

This equation can be written as:

$$d\vec{B}(\vec{r}) = \vec{G}(\vec{r},\vec{r}',\vec{H})\chi(\vec{r}')dv' \quad (25)$$

where we introduce a vector Green's function:

$$\vec{G}(\vec{r},\vec{r}',\vec{H}) = \frac{\mu_o}{4\pi}\left\{ \frac{3\vec{H}(\vec{r}')\cdot(\vec{r}-\vec{r}')}{|\vec{r}-\vec{r}'|^5}(\vec{r}-\vec{r}') - \frac{\vec{H}(\vec{r}')}{|\vec{r}-\vec{r}'|^3} \right\} \quad \text{Eq. 26}$$

The components of $\vec{G}$ are simply:

$$\vec{G} = G_x\hat{x} + G_y\hat{y} + G_z\hat{z} \quad (27)$$

where:

$$G_x(\vec{r},\vec{r}',\vec{H}) = \frac{\mu_o}{4\pi}\left\{ \frac{3\vec{H}\cdot(\vec{r}-\vec{r}')}{|\vec{r}-\vec{r}'|^5}(x-x') - \frac{H_x}{|\vec{r}-\vec{r}'|^3} \right\} \quad \text{Eq. 28}$$

$$G_y(\vec{r},\vec{r}',\vec{H}) = \frac{\mu_o}{4\pi}\left\{ \frac{3\vec{H}\cdot(\vec{r}-\vec{r}')}{|\vec{r}-\vec{r}'|^5}(y-y') - \frac{H_y}{|\vec{r}-\vec{r}'|^3} \right\} \quad \text{Eq. 29}$$

$$G_z(\vec{r},\vec{r}',\vec{H}) = \frac{\mu_o}{4\pi}\left\{ \frac{3\vec{H}\cdot(\vec{r}-\vec{r}')}{|\vec{r}-\vec{r}'|^5}(z-z') - \frac{H_z}{|\vec{r}-\vec{r}'|^3} \right\} \quad \text{Eq. 30}$$

The three components of the magnetic field in Equation 25 can now be written as:

$$dB_x(\vec{r}) = \chi(\vec{r}')G_x(\vec{r},\vec{r}',\vec{H}) \quad (31)$$

$$dB_y(\vec{r}) = \chi(\vec{r}')G_y(\vec{r},\vec{r}',\vec{H}) \quad (32)$$

$$dB_y(\vec{r}) = \chi(\vec{r}')G_y(\vec{r},\vec{r}',\vec{H}). \quad (33)$$

Note that $\vec{H}$ may in turn be a function of x', y', and z'. In contrast, the Green's function in Equation 18 did not contain $\vec{H}$. However, $\vec{H}$ is assumed to be known and only adds a geometrically-variable scale factor into the Green's function. The increased complexity of Equations 28 through 30 arises from our desire to include $\vec{H}$ as a vector field with three independently-specified components.

If we know both the location $\vec{r}'$ of a source that is only a single dipole, and also the strength and direction of $\vec{H}$ at that point, we can make a single measurement of the magnetic field at $\vec{r}$ to determine $\chi(\vec{r}')$. It is adequate to measure only a single component of $\vec{B}(\vec{r}')$ as long as that component is non-zero. The problem becomes somewhat more complex when there are either multiple dipoles or a continuous distribution of dipoles. In that case, we need to summate or integrate Equation 25 over the entire source object:

$$\vec{B}(\vec{r}) = \int_{x'}\int_{y'}\int_{z'} \vec{G}(\vec{r},\vec{r}',\vec{H})\chi(\vec{r}')dv' \quad \text{Eq. 34}$$

To proceed numerically, we will assume that we can discretize the source object into m elements of volume $v_j$ where $1 \leq j \leq m$. The field from this object is then:

$$\vec{B}(\vec{r}) = \sum_{j=1}^{m} \vec{G}(\vec{r},\vec{r}_j,\vec{H})\chi(\vec{r}_j)v_j \quad \text{Eq. 35}$$

A single measurement of $\vec{B}$ will be inadequate to determine the susceptibility values for the m elements. Thus, we must make our measurements at n measurement points, where $1 \leq i \leq n$ identifies each such measurement. The measurements are made at points $\vec{r}_i$. Three field components measured at a single point would constitute, in this notation, three independent scalar measurements which happen to have the same value for $\vec{r}$. Equation 35 becomes:

$$\vec{B}_i(\vec{r}_i) = \sum_{j=1}^{m} \vec{G}(\vec{r}_i,\vec{r}_j,\vec{H})\chi(\vec{r}_j)v_j. \quad \text{Eq. 36}$$

To simplify analysis, we can convert to matrix notation. In this case, the vector Green's function $\vec{G}$ becomes a n×m matrix $\vec{G}$ that contains as each of its rows the Green's functions that relate a single measurement to every source element, i.e. Equation 36. The n field measurements can be written as the n elements of n×1 column matrix $\tilde{B}$). The magnetic susceptibility of each of the m source elements can be described by a m×1 column matrix $\tilde{\chi}$. The volume of each source element can be incorporated into either the $\tilde{\tilde{G}}$ or $\tilde{\chi}$ matrices. The measurements are related to the sources by:

$$\tilde{B} = \tilde{\tilde{G}} \tilde{\chi} \qquad (37)$$

If n=m, the system of equations will be exactly determined, but it may not be possible to obtain a solution because of measurement noise. The alternative is to choose n>m, so that the system becomes over determined and a least-squares solution can be attempted. While there are several ways to proceed, we will consider only the general approach of multiplying from the left both sides of Equation 37 by $\tilde{\tilde{G}}^T$, the transpose of $\tilde{\tilde{G}}$:

$$\tilde{\tilde{G}}^T \tilde{B} = \tilde{\tilde{G}}^T \tilde{\tilde{G}} \tilde{\chi} \qquad (38)$$

$\tilde{\tilde{G}}^T \tilde{\tilde{G}}$ is now an m x m matrix that in principle can be inverted. This allows us to solve for $\tilde{\chi}$:

$$[\tilde{\tilde{G}}^T \tilde{\tilde{G}}]^{-1} \tilde{\tilde{G}}^T \tilde{B} = \tilde{\chi} \qquad (39)$$

The ability to compute the inverse of the $\tilde{\tilde{G}}^T \tilde{\tilde{G}}$ matrix is determined by the measurement noise, by how well the measurements span the source space, and by the othogonality of the source components. Typically, if this inversion process is attempted by measurements made in a single plane over a complex source, the near elements of the source will dominate and the matrix will be ill-conditioned.

The method to avoid the ill-conditioned nature of Equation 39 is to apply the magnetic field from a number of different directions and to measure the magnetic field at multiple locations all around the object. Since n>m, the system of equations becomes highly overdetermined. Since the direction of the magnetization of each voxel of the material is known for every measurement, and this direction is varied, the domination of the $\tilde{\tilde{G}}^T \tilde{\tilde{G}}$ matrix by a small set of measurements is avoided. Equation 39 then becomes highly overdetermined, and the stability of the solution is enhanced. It is then possible to use Singular Value Decomposition (SVD) or other techniques to solve for the susceptibility of each voxel.

In implementing susceptibility tomography in accordance with the invention, arrays of perturbation readings for a plurality of orientations between the magnetic field, the magnetometers and the position of the object are generated and processed to generate local susceptibilities at any desired site within the object. This can include generating a map of local susceptibility throughout the object. One particularly useful approach is to generate a map of susceptibility along a particular plane through the object. In generating these arrays of perturbation signals, one or more of the three conditions: the direction of the magnetic field, the position at which the perturbations are measured by the magnetometer and the orientation of the object are varied. A preferred technique is to maintain the magnetic field and magnetometer fixed, and to reposition the object. This has the advantage that the magnetometer can be more easily nulled for the applied field for all perturbation readings. Of course, the field and the magnetometer can be maneuvered as a unit where the object is immobile. In another arrangement, a plurality of sets of fixed position field coils can be sequentially energized to vary the magnetic field direction, or alternatively, energized with different combinations of current to vary the orientation of the resultant field.

A system 1 for carrying out the invention is illustrated in FIG. 1. The object 3 made of a diamagnetic and/or paramagnetic material is placed between the coils of a Helmholtz coil pair 5 which applies a substantially uniform magnetic field to the object 3. Typically, the field strength is between about $10^{-4}$ and $10^2$ T. The magnetic field does not have to be uniform as long as its intensity and direction throughout the object are known, however, the use of a uniform field simplifies the susceptibility calculations. Perturbations to the magnetic field attributable to the susceptibility in various parts of the object are measured by a magnetometer unit 7.

The system 1 as shown in FIG. 1 provides for independent adjustment of the orientations of the magnetic field generated by the Helmholtz coil pair 5, the orientation of object 3 and the position of the magnetometer unit 7. As indicated above, it is not necessary that the orientation of all three of these conditions be varied. Only one need be varied, and not necessarily the same one each time, to generate the plurality of perturbation readings required for susceptibility tomography. For mapping of a two dimensional object or surface mapping of a three dimensional object, only a single orientation of the magnetic field, magnetometer, and object are required. For each orientation, the magnetometer 7 generates an array of perturbation signals representative of the local disturbance to the applied magnetic field B at a plurality of locations across the object. As will be seen, the array of perturbation signals can be generated by a single magnetometer, or a small magnetometer array, scanned over the object or a portion of the object for which the susceptibility is to be mapped, either by movement of the magnetometer unit or the object, or a large array of magnetometers covering the locations at which susceptibility measurements are to be made can be scanned electronically.

In the generalized system of FIG. 1, the magnet pair 5 is energized by a magnet power supply 9 and magnet position is controlled automatically by magnet position controls 11. Magnetometer electronics 13 control energization of the magnetometer 7 and generate perturbation signals representing the effects on the magnetic field applied by the coil pair 5 to the local susceptibility of the object 3. Where required, the position of the magnetometer for generating multiple arrays of perturbation signals is controlled by the magnetometer position control 15. Also, where required, the position of the object relative to the magnet 5 and magnetometer 7 is controlled by a sample position control 17.

The entire system 1 is controlled by a computer system 19. The computer system 1 includes a master controller 21 which controls the operation of the magnet, magnetometer and sample position controls 11, 15 and 17, and the magnet power supply 9 and magnetometer electronics 13. Data acquisition electronics 23 process the perturbation signals received from the magnetometer electronics 13. This processing includes digitizing the analog perturbation signals for further processing by a susceptibility tomography algorithm 25. In the case of two dimensional objects, or when only surface susceptibility of a three dimensional object is to be mapped, the appropriate algorithm for two dimensional mapping replaces the susceptibility tomography algorithm 25. The appropriate algorithm generates the desired susceptibility map which is transmitted to an output and display device 27. This output and display device 27 may be, for example, a video monitor, a plotter, printer and/or a chart recorder.

Figure 2:
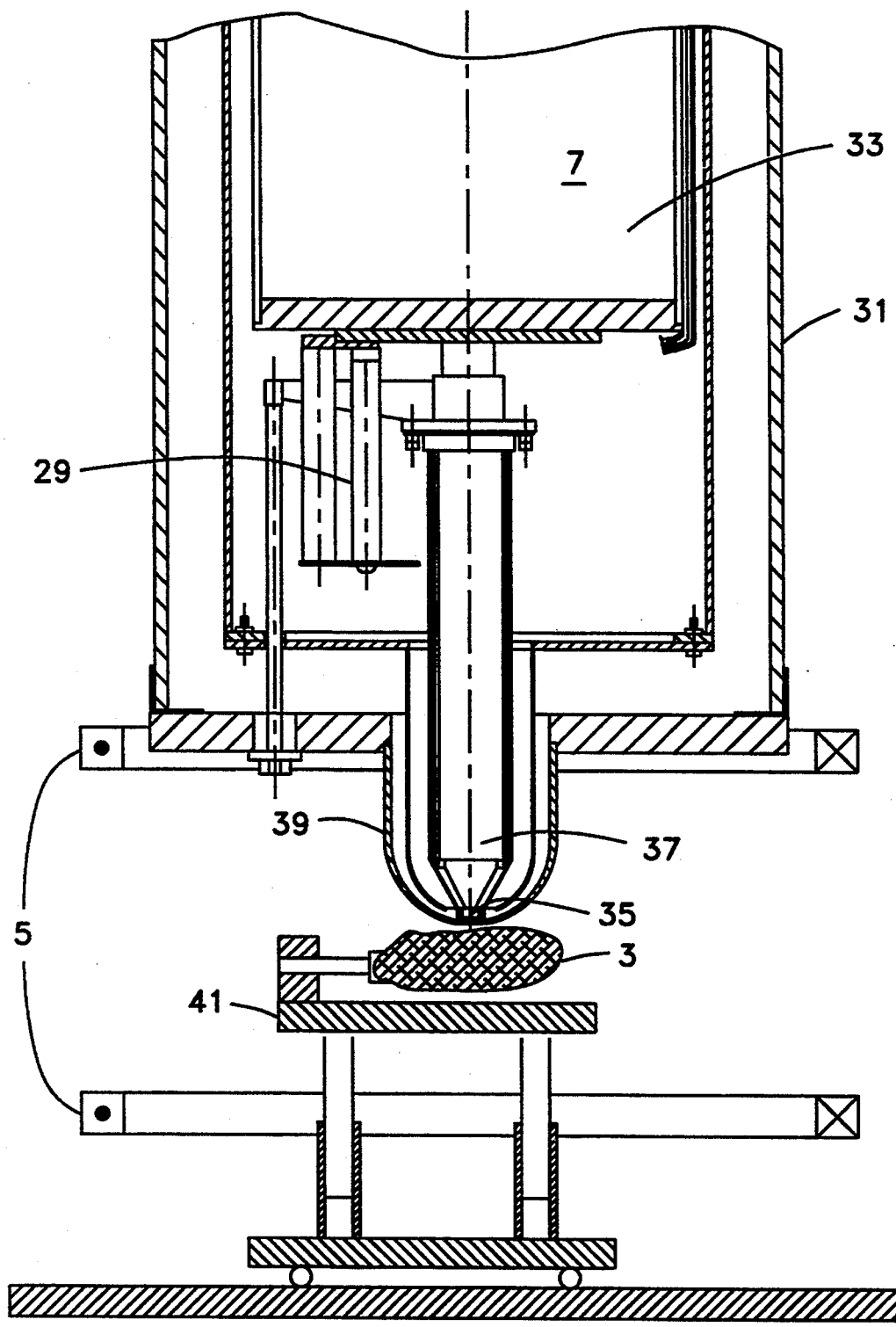
FIG. 2 schematically illustrates a SQUID magnetometer suitable for use in the system of FIG. 1.

The magnetometer 7 of the system 1 can be, for instance, a flux gate or other type of magnetometer, however, it is preferred that the magnetometer be a superconducting quantum interference device (SQUID) magnetometer. An example of a suitable SQUID magnetometer 7 is illustrated in FIG. 2. The SQUID 29 is mounted inside a cryogenic dewar 31 where it is maintained at a temperature of about 4K by liquid helium from a reservoir 33. High resolution pickup coils 35 mounted on the end of a thermal finger 37 which projects into a dome-shaped vacuum casing 39 provide input of the magnetic field measurements to the SQUIDs 29. This arrangement permits the pickup coils 35 to be positioned within 1.5 mm of the sample object. In FIG. 2, the sample object 3 is supported on a sample stage platform 41 which can be translated in the x and y directions for scanning of the magnetometer over the object to generate the array of perturbation signals. The platform 41 can also adjust the Z height and rotate, the sample about one or more axes. This setup is suitable for two dimensional mapping of the surface of the object 3. For susceptibility tomography, the position of the object is adjusted, such as by rotation, for each scan of the magnetometer.

Figure 3:
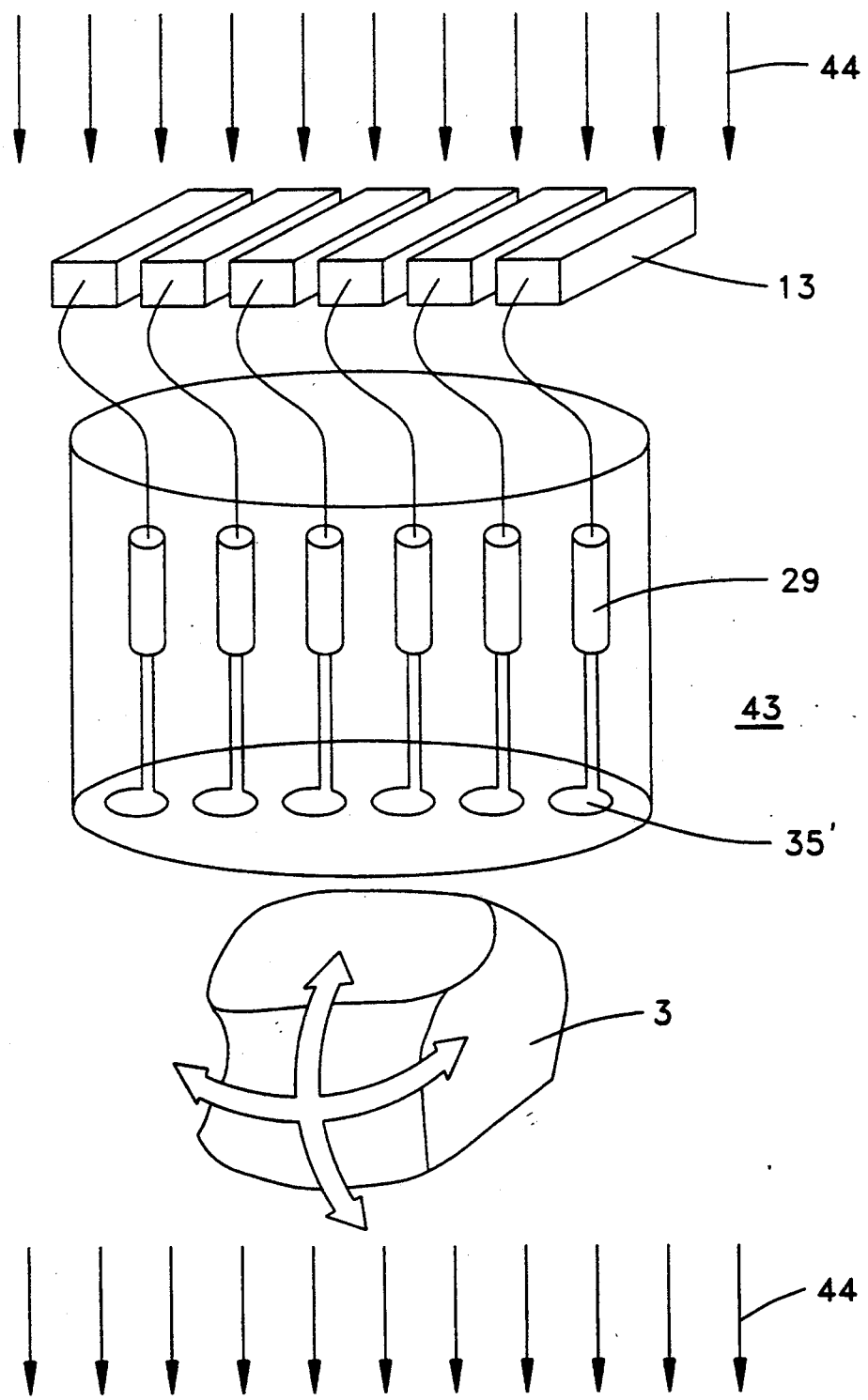
FIG. 3 schematically illustrates a large SQUID array which electronically scans perturbations in an applied magnetic field across an object.

The magnetometer 7 illustrated in FIG. 2 is a four channel magnetometer having four SQUIDs 29 each with a pickup coil 35, and with the coils arranged in a rectangular array. This small array of coils is scanned mechanically by operation of the sample platform 41 that is capable of translating the sample in the x, y, and z directions, and also rotating the sample about one or more axes, to generate the measurements of magnetic field perturbations at the array of locations across the object. Alternatively, a linear array 43 having a separate SQUID 29 each with a pickup coil 35 at each of the locations at which measurements are to be made as shown in FIG. 3 can be substituted for the magnetometer shown in FIG. 2 so that scans need be made only along a single axis.

Figure 4:
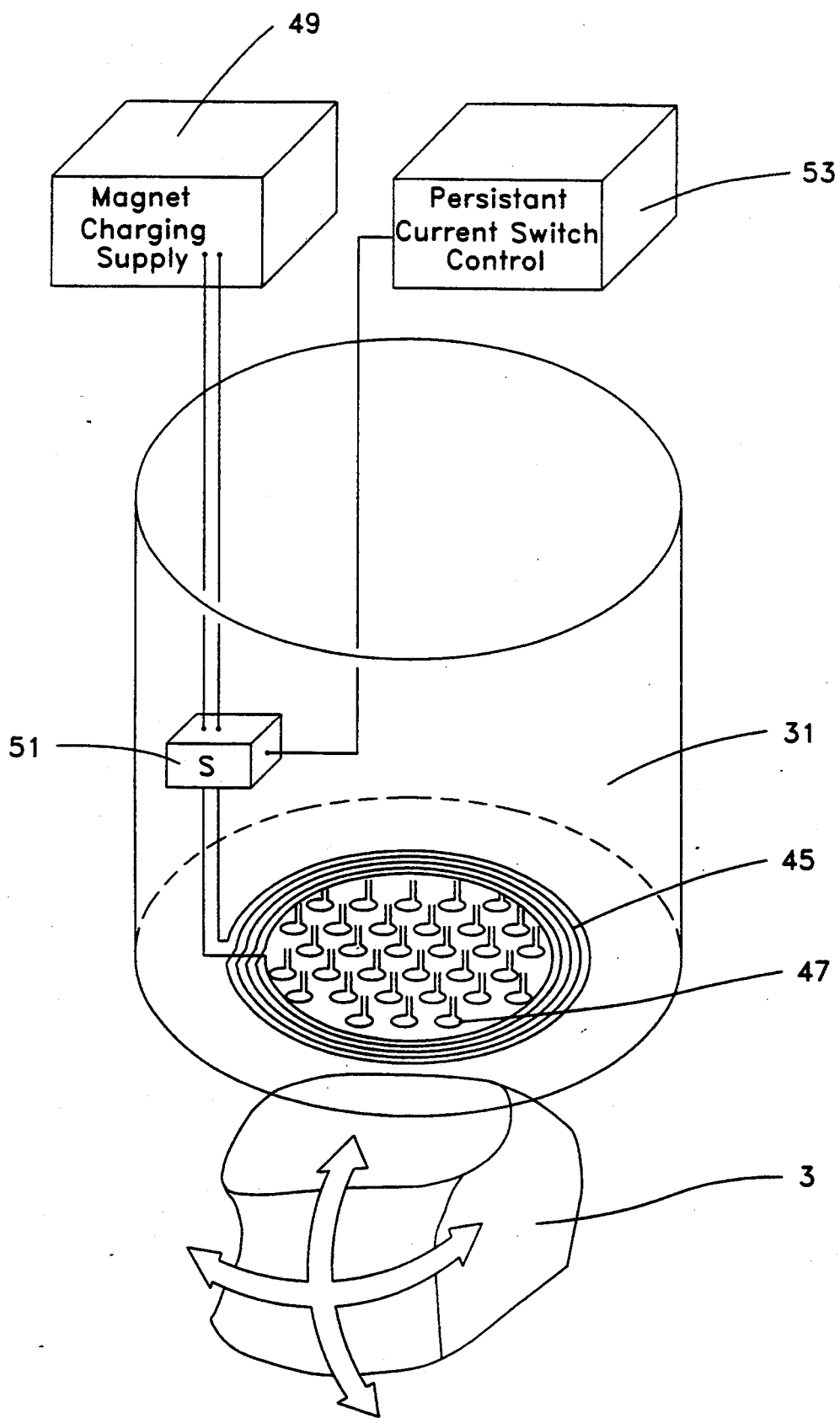
FIG. 4 schematically illustrates a superconducting magnet which can be used an an alternative to the warm magnets used in the system of FIGS. 1 and 2.

As an alternative to the warm Helmoltz coil pair 5 used for generating the magnetic field, a superconducting magnet can be employed. As shown in FIG. 4, the superconducting magnet 45 is mounted inside the cryogenic container 31 together with a two dimensional SQUID array 47. Current is supplied To the superconducting magnet from a magnet charging supply 49 through a persistent current switch 51. A persistent current switch control 53 operates the switch 51 to initially inject current from the magnet charging circuit 49 into the superconducting magnet 45, to then circulate the current in the magnet and to dump the circulating current back to the magnet charging supply 49 for shutdown of the magnet.

Figure 5:
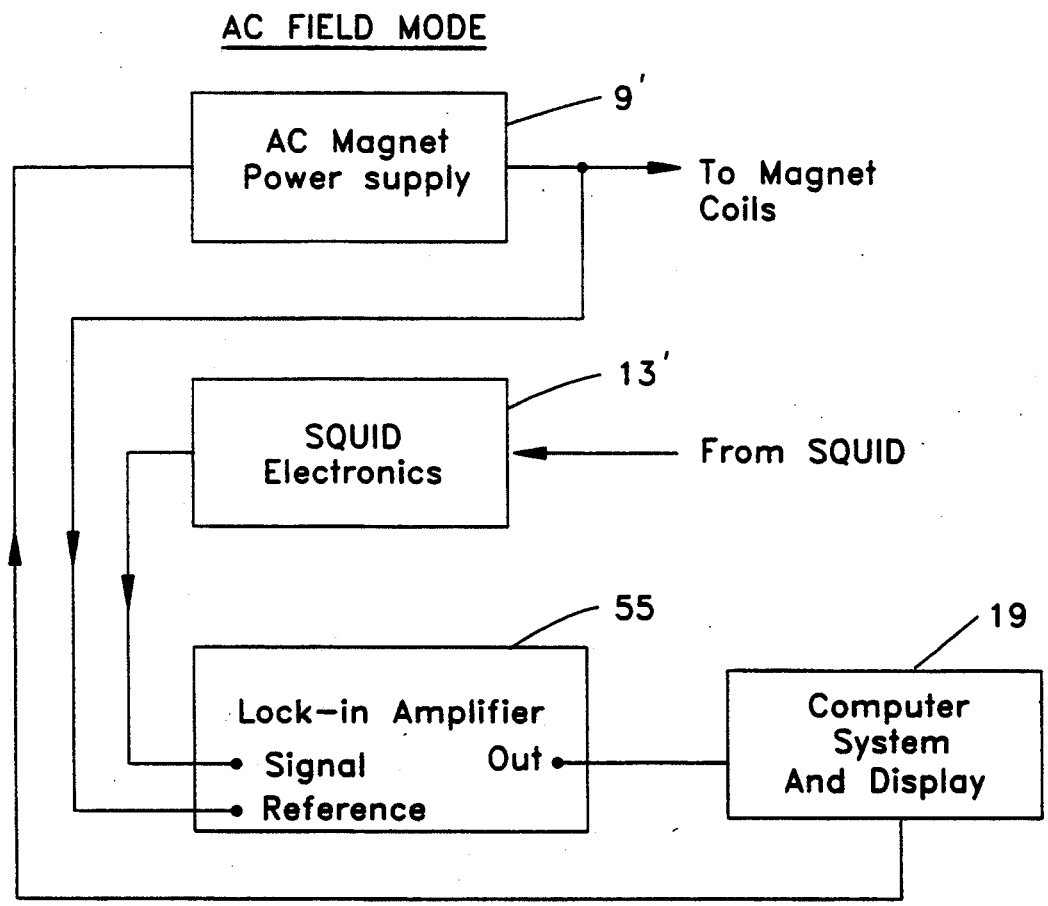
FIG. 5 is a schematic diagram of a portion of the system of FIG. 1 modified to operate with an ac magnetic field.

The invention can be used either with dc or ac magnetic fields. When ac magnetic fields are utilized, the output of the ac magnet power supply 9' is sent to a lock-in amplifier 55 together with the output from the SQUID electronics 13'. The output of the lock-in is sent to the computer system 19, as shown in FIG. 5.

Figure 6:
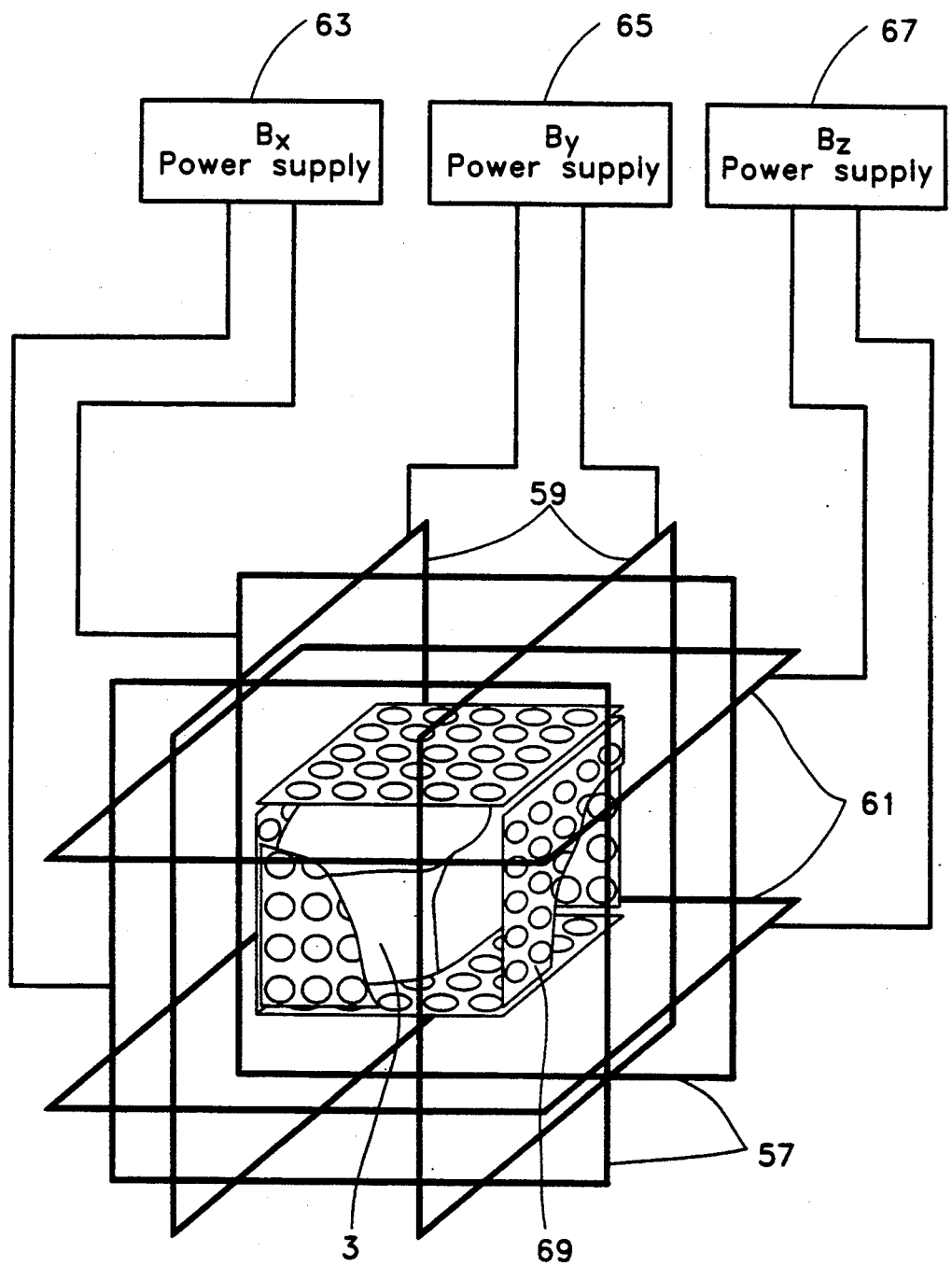
FIG. 6 illustrates an alternative embodiment of the system of FIG. 1 utilizing three orthogonal sets of electromagnets and six perpendicular planar SQUID arrays.

Another embodiment of the invention is illustrated in FIG. 6. In this embodiment, three mutually orthogonal sets of square Helmoltz coil pairs 57, 59 and 61, each energized by its own power supply 63, 65 and 67, respectively, are arranged around the sample object 3. These fixed position sets of coils may be energized sequentially to generate three orthogonal orientations of the magnetic field applied to the sample object 3 for susceptibility tomography. Alternatively, the three sets of coils can be energized simultaneously, but with varying levels of current in sequential time intervals to generate a resultant magnetic field which assumes varying orientations with respect to the object for generating the plurality of arrays of perturbation signals required for susceptibility tomography. As illustrated schematically in FIG. 6, an array of magnetometers 69 can be positioned relative to the object to record the magnetic field perturbations. By using a large fixed array and the fixed pairs of magnets no mechanical movements are required for performing susceptibility tomography. As indicated in FIG. 6, more than one array of magnetometers can be used to record perturbations of the magnetic field in different planes or a curved array 7 in FIG. 1, if desired.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

We claim:

1. A system for imaging the structure of at least a selected portion of an object substantially composed of at least one of diamagnetic and paramagnetic materials, said system including:

means applying a magnetic field of known strength, orientation and time dependence to the at least selected portion of said object:

magnetometer means measuring local perturbations in the applied magnetic field indicating local susceptibility of said object at an array of locations across said at least selected portion of said object to generate an array of perturbation signals;

adjusting means adjusting the angular orientation of at least one of said magnetic field, said object, and said magnetometer means relative to the others to generate a plurality of relative orientations, said magnetometer means including means measuring local perturbations in the applied magnetic field at an array of locations for each of said plurality of relative orientations to produce a plurality of arrays of perturbation signals;

processing means processing by matrix decomposition techniques said plurality of arrays of perturbation signals to generate at least one array of signals representing a map of local susceptibilities at selected sites in said at least selected portion of said object; and means presenting said array of local susceptibilities at the selected sites in the at least selected portion of said object.

2. The system of claim 1 wherein said magnetometer means comprises a plurality of magnetometers arranged adjacent the at least selected portion of said object in a pattern corresponding to said array of locations across said at least selected portion of said object.

3. The system of claim 1 wherein said magnetometer means includes a magnetometer unit, means positioning said magnetometer unit adjacent the at least selected portion of such object and means generating relative movement between said magnetometer unit and said object to scan said magnetometer unit over said array of locations across said at least selected portion of said object.

4. The system of claim 3 wherein said magnetometer unit comprises an array of magnetometers smaller than said selected portion of said object.

5. The system of claim 1 wherein said magnetometer means includes superconducting quantum interference device (SQUID) magnetometer means.

6. The system of claim 1 wherein said magnetometer means comprises gradient magnetometers positioned relative to said magnetic field to measure only the perturbations in said applied field while substantially eliminating direct measurement of the applied field.

7. The system of claim 1 wherein said processing means includes means generating an array of susceptibility signals representing the distribution of susceptibilities along a selected plane through said at least selected portion of said object.

8. The system of claim 1 wherein said adjusting means adjusts the orientation of said object relative to said magnetic field and said magnetometer means to generate said plurality of relative orientations while maintaining the orientation of said magnetic field and said magnetometer means fixed.

9. The system of claim 1 wherein said adjusting means adjusts the orientation of said magnetic field relative to the orientation of said object and the magnetometer means to generate said plurality of relative orientations.

10. The system of claim 1 wherein said means applying said magnetic field to the at least selected portion of said object comprises a plurality of coil means arranged in a plurality of angular orientations relative to said object and the adjusting means includes means sequentially energizing said plurality of coil means.

11. The system of claim 1 wherein said means applying said magnetic field to the at least selected portion of said object comprises a plurality of coil means arranged in a plurality of orientations relative to said object and the adjusting means includes means energizing said plurality of coil means with a plurality of combinations of currents to generate a plurality of angular orientations of said magnetic field.

12. The system of claim 1 wherein said means generating said applied field is a superconducting magnet and said magnetometer means comprises SQUID magnetometer means.

13. The system of claim 1 wherein said means applying said magnetic field applies a dc magnetic field to said at least selected portion of said object.

14. The system of claim 1 wherein said means applying said magnetic field applies an ac magnetic field to said at least selected portion of said object.

15. A system for imaging the structure of at least a selected portion of an object substantially composed of at least one of diamagnetic and paramagnetic materials, said system including:
coil means applying a substantially uniform magnetic field to the at least selected portion of said object;
gradient SQUID magnetometer means measuring local perturbations in the applied magnetic field indicating local susceptibility of said object at an array of locations across said at least selected portion of said object to generate an array of perturbation signals;
adjusting means adjusting the angular orientation of at least one of said magnetic field, said object, and said magnetometer means relative to the others to generate a plurality of relative orientations, said gradient SQUID magnetometer means measuring local perturbations in the applied magnetic field at an array of locations for each of said plurality of relative orientations to produce a plurality of arrays of perturbation signals;
processing means processing by matrix decomposition techniques said plurality of arrays of said perturbation signals to generate at least one array of signals representing a map of local susceptibilities at the selected sites in said at least selected portion of said object; and
means generating an image from said array of local susceptibilities at the selected sites in the at least selected portion of said object.

16. A method of imaging the structure of objects substantially composed of diamagnetic or paramagnetic materials and combinations thereof, said method comprising:
applying a magnetic field of known strength and known time dependence to said object in a known orientation;
scanning said object with magnetometer means to generate perturbation signals representing local perturbations to the magnetic field across at least a selected portion of said object resulting from local variations in susceptibility of the object;
adjusting the angular orientation of at least one of said magnetic field, said object, and said magnetometer means relative to the others to generate a plurality of relative orientations, and repeating said scanning said object with said magnetometer means for each relative orientation to generate sets of perturbation signals each representing local perturbations to the magnetic field for one of said plurality of relative orientations; and
processing using matrix decomposition techniques said sets of perturbation signals to indicate local susceptibility at at least selected sites in said at least selected portion of said object.

17. A method of imaging features of at least a selected portion of an object substantially composed of at least one of diamagnetic and paramagnetic materials, said method comprising steps of:
applying a magnetic field of known strength and orientation to said at least selected portion of said object:
measuring perturbations in the applied magnetic field indicating local susceptibility of said object at an array of locations across said at least selected portion of said object to generate an array of perturbation signals;
adjusting the angular orientation of at least one of said magnetic field, said object, and a magnetometer means relative to the others to generate a plurality of relative orientations, said measuring further including measuring said perturbations in the applied magnetic field at an array of locations for each of said plurality of relative orientations to produce a plurality of arrays of perturbation signals; and
processing using matrix decomposition techniques said plurality of arrays of perturbation signals to generate at least one array of signals representing a map of local magnetic susceptibilities at least selected sites in said at least selected portion of said object.

18. The method of claim 17 wherein said means of measuring perturbations in the applied magnetic field for each of said plurality of relative orientations comprises generating relative movement between said selected portion of said object and a magnetometer unit and measuring the local perturbations as said magnetometer unit scans relative to said object.

19. The method of claim 17 wherein a step of measuring perturbations in the applied magnetic field comprises electronically scanning an array of magnetometers placed adjacent said at least selected portion of said object for each of said plurality of relative orientations.

20. A method of non-destructive testing for flaws such as cracks and holes in a surface of an object substantially composed of at least one of diamagnetic and paramagnetic materials, said method comprising:
applying a trace material having a susceptibility substantially different from the susceptibility of said object to the surface of said object to introduce said trace material into any flaws in said surface;
applying a magnetic field to said object including said surface;
scanning said surface with a magnetometer to measure perturbations in said applied magnetic field representing local susceptibility across said surface; and
processing said measured perturbations in the magnetic field to identify the location of trace material in said any flaw in said surface.

21. The method of claim 20 wherein said processing includes determining a volume of said flaw from the volume of said trace material in said any flaw.

22. A method of non-destructive testing of an object substantially composed of at least one of diamagnetic and paramagnetic materials, said method comprising:
dispersing throughout at least a selected portion of said object a trace material having a susceptibility substantially different from the susceptibility of the object;
applying a magnetic field of known strength, orientation and time dependence to said object;
scanning said object with magnetometer means to generate perturbation signals representing local perturbations to the magnetic field across at least the selected portion of said object resulting from local variations in susceptibility of the object and said trace material; and
processing said perturbation signals to generate a representation of local susceptibility of the object and the trace material in at least selected locations in said at least selected portion of said object.

23. The method of claim 22 including adjusting the orientation of at least one of said magnetic field, said object, and said magnetometer means relative to the others to generate a plurality of relative orientations, scanning said object with said magnetometer means for each relative orientation to generate sets of perturbation signals each representing local perturbations to the magnetic field for one of said plurality of relative orientations, and processing said sets of perturbation signals to indicate local susceptibility of said object and said trace material at at least selected sites in at least selected portion of said object.

24. A method of non-destructive testing for flaws such as cracks and holes in a surface of an object substantially composed of at least one of diamagnetic and paramagnetic materials, said method comprising:
applying a trace material having a susceptibility substantially different from the susceptibility of said object to the surface of said object to introduce said trace material into any flaws in said surface;
applying a magnetic field to said object including said surface;
scanning said surface with a magnetometer to measure perturbations in said applied magnetic field representing local susceptibility across said surface at an array of locations across said surface; and
processing said measured perturbations in the magnetic field to generate a map of local susceptibilities imaging said any flaws.

25. A method of non-destructive testing of an object substantially composed of at least one of diamagnetic and paramagnetic materials, said method comprising:
dispersing throughout at least a selected portion of said object a trace material having a susceptibility substantially different from the susceptibility of the object;
applying a magnetic field of known strength, orientation and time dependence to said object;
scanning said object with magnetometer means to generate perturbation signals representing local perturbations to the magnetic field at an array of locations across at least said selected portion of said object resulting from local variations in susceptibility of the object and said trace materials; and
processing said perturbation signals to generate a map of local susceptibility of the object and trace material in said at least selected portion of said object.

* * * * *

UNITED STATES PATENT AND TRADEMARK OFFICE
CERTIFICATE OF CORRECTION

PATENT NO.  :   5,408,178
DATED       :   April 18, 1995
INVENTOR(S) :   JOHN P. WIKSWO, JR. et al.

It is certified that error appears in the above-identified patent and that said Letters Patent is hereby corrected as shown below:

In column 4, line 34, "she" should be --the--.

In column 5, equation (1) should read --x = M/H--.

In column 5, in equation (6), "diagramatic" should be --diamagnetic--.

Claim 17, column 17, line 2, "at least" should read --at at least--.

Signed and Sealed this

Twelfth Day of November, 1996

Attest:

BRUCE LEHMAN

Attesting Officer          Commissioner of Patents and Trademarks